US012701783B2

(12) United States Patent
Lin

(10) Patent No.: US 12,701,783 B2
(45) Date of Patent: Aug. 4, 2026

(54) SEMICONDUCTOR DEVICE WITH SEMICONDUCTOR COMPONENTS

(71) Applicant: Taiwan Semiconductor Manufacturing Company, Ltd., Hsinchu (TW)

(72) Inventor: Ta-Chun Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 578 days.

(21) Appl. No.: 18/099,806

(22) Filed: Jan. 20, 2023

(65) Prior Publication Data

US 2024/0105722 A1 Mar. 28, 2024

Related U.S. Application Data

(60) Provisional application No. 63/409,399, filed on Sep. 23, 2022.

(51) Int. Cl.
| | |
|---|---|
| *H10D 84/00* | (2025.01) |
| *H10D 30/01* | (2025.01) |
| *H10D 30/43* | (2025.01) |
| *H10D 30/67* | (2025.01) |
| *H10D 62/10* | (2025.01) |
| *H10D 84/01* | (2025.01) |
| *H10D 84/03* | (2025.01) |
| *H10D 84/85* | (2025.01) |

(52) U.S. Cl.
CPC ............ *H10D 84/85* (2025.01); *H10D 30/014* (2025.01); *H10D 30/43* (2025.01); *H10D 30/6735* (2025.01); *H10D 62/121* (2025.01); *H10D 84/0188* (2025.01); *H10D 84/038* (2025.01)

(58) Field of Classification Search
CPC ........... H10D 84/0188; H10D 84/0151; H10D 84/8316; H10D 84/0147
See application file for complete search history.

(56) References Cited

U.S. PATENT DOCUMENTS

| | | | | |
|---|---|---|---|---|
| 11,239,236 B2 * | 2/2022 | Lilak | .................... | H10D 84/856 |
| 2011/0306198 A1 * | 12/2011 | Jeong | .................. | H10D 30/601 |
| | | | | 257/E21.19 |
| 2013/0270613 A1 * | 10/2013 | Chou | .................. | H10D 64/017 |
| | | | | 257/E21.409 |
| 2018/0145172 A1 * | 5/2018 | Zhou | ................. | H01L 21/02107 |

FOREIGN PATENT DOCUMENTS

WO WO-2022170605 A1 * 8/2022 ............. H10D 30/60

* cited by examiner

*Primary Examiner* — Reema Patel
(74) *Attorney, Agent, or Firm* — Birch, Stewart, Kolasch & Birch, LLP

(57) ABSTRACT
A semiconductor device is provided. The semiconductor includes a plurality of semiconductor components and at least two dielectric walls disposed among the semiconductor components. Two of the dielectric walls, which are adjacent, extended along one direction or disposed at two sides of a device isolation, have varied wall widths or offset.

20 Claims, 8 Drawing Sheets

100

100

200

300

400

441    442    431    443    444

411

D1 ---- 421

412

413

422

414

500

FS51        FS52

541        543

600

FS61     FS62

632     631     633

700

FS71     FS72

732     743     733

SEMICONDUCTOR DEVICE WITH SEMICONDUCTOR COMPONENTS

PRIORITY CLAIM AND CROSS-REFERENCE

This application claims the benefit of U.S. provisional application Ser. No. 63/409,399, filed Sep. 23, 2022, the subject matter of which is incorporated herein by reference.

BACKGROUND

The disclosure relates in general to a semiconductor device, and more particularly to a semiconductor device having a plurality of dielectric walls.

With the development of the semiconductor technology, the size of semiconductor device is gradually reduced. Numerous components must be tightly arranged to reduce the overall volume of the semiconductor device.

However, a certain spacing between components is still required to avoid mutual interference. In order to make the components closer together, a dielectric wall is developed, which can reduce the spacing between components in addition to avoiding mutual interference.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
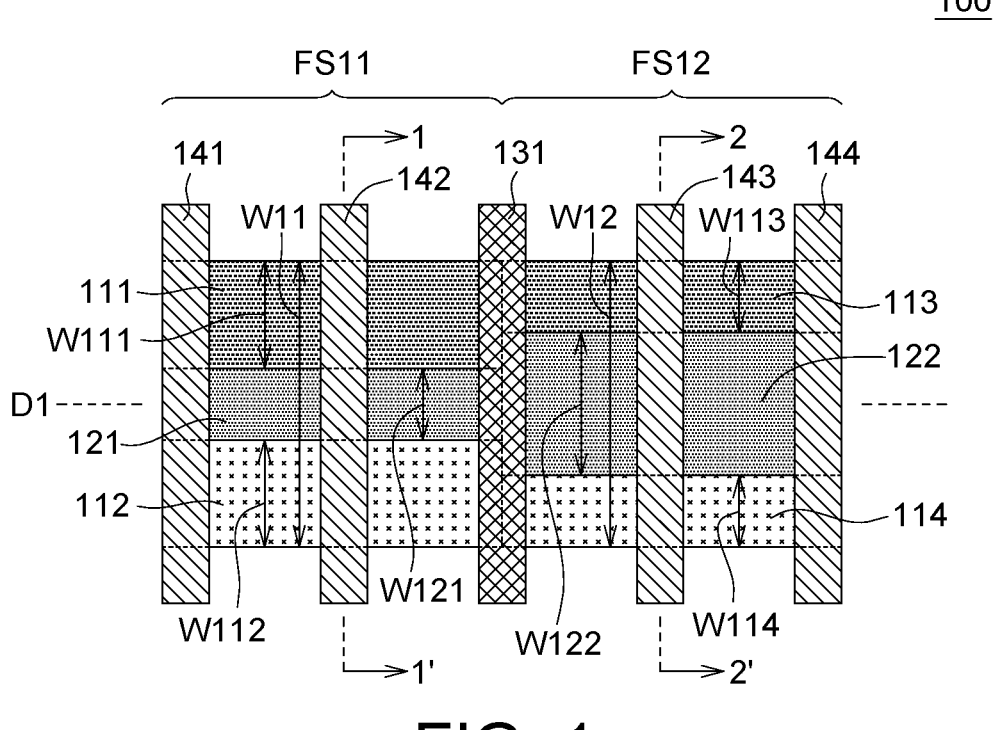
FIG. 1 shows a semiconductor device according to one embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Please refer to FIG. 1, which shows a semiconductor device 100 according to one embodiment. The semiconductor device 100 includes, for example, a plurality of semiconductor components 111, 112, 113, 114, a plurality of dielectric walls 121, 122, at least one device isolation 131, and at least two gates 141, 142, 143, 144. The material of the dielectric walls 121, 122 may be SiN, SiO2, SiON, SiCON, SiCO, High-K material, such as HfO, AlO, or the combination thereof. The material of the dielectric wall 121, and the material of the dielectric wall 122 may be the same or different. The material of the device isolation 131 may be SiN, SiO2, SiON, SiCON, SiCO, High-K material, such as HfO, AlO, or the combination thereof.

For reducing the overall volume of the semiconductor device 100, the semiconductor components 111, 112, 113, 114 are tightly arranged. In order to make the semiconductor components 111, 112 closer together, the dielectric wall 121 is formed between the semiconductor components 111, 112, so that the spacing between the semiconductor components 111, 112 is reduced and the mutual interference can be avoided.

Similar, in order to make the semiconductor components 113, 114 closer together, the dielectric wall 122 is formed between the semiconductor components 113, 114, so that the spacing between the semiconductor components 113, 114 is reduced and the mutual interference can be avoided.

In one embodiment, the semiconductor device 100 may a combination of at least two forksheet devices FS11, FS12. For example, the semiconductor component 111 may be a NMOS, the semiconductor component 112 may be a PMOS. The semiconductor component 111, the semiconductor component 112, the dielectric wall 121 and the gates 141, 142 form the forksheet device FS11. The semiconductor component 113 may be a NMOS, the semiconductor component 114 may be a PMOS. The semiconductor component 113, the semiconductor component 114, the dielectric wall 122 and the gates 143, 144 form the forksheet device FS12.

The device isolation 131 is disposed between the two forksheet devices FS11, FS12 to avoid any interference between the forksheet devices FS11, FS12. Referring to FIG. 1, the device isolation 131 is disposed between the dielectric walls 121, 122, between the semiconductor components 111, 113 and between the semiconductor component 112, 114.

Referring to FIG. 1, the two dielectric walls 121, 122 are disposed among the semiconductor components 111, 112, 113, 114. The two dielectric walls 121, 122, which are adjacent, have varied wall widths W121, W122. The two dielectric walls 121, 122, which are extended along one direction D1, have varied wall widths W121, W122. The two dielectric walls 121, 122, which are disposed at two sides of the device isolation 131, have varied wall widths W121, W122. That is to say, the dielectric walls 121, 122, which are adjacent, extended along one direction D1, or disposed at two sides of the device isolation 131, do not need to have the same wall width, so the device architecture can be flexible. For example, the semiconductor component 111 and the semiconductor component 113 do not need to have the same size, and the semiconductor component 112 and the semiconductor component 114 do not need to have the same size.

As shown in FIG. 1, the semiconductor components 111, 112, 113, 114 respectively have active region widths W111, W112, W113, W114 which are also called oxide defined widths. The active region widths W111, W112 may be different from the active region widths W113, W114. For example, as shown in FIG. 1, the wall width W121 of the forksheet device FS11 is less than the wall width W122 of the forksheet device FS12, but the active region widths W111, W112 of the forksheet device FS11 are larger than the active region widths W113, W114 of the forksheet device FS12. There is an inverse relationship between a plurality of active region widths W111, W112, W113, W114 of the semiconductor components 111, 112, 113, 114 and the wall widths W121, W122.

In FIG. 1, the total width W11 of the forksheet device FS11 is substantially identical to the total width W12 of the forksheet device FS12, the difference between the wall width W121 and the wall width W122 is identical to the difference between the sum of the active region widths W111, W112 and the sum of the active region widths W113, W114. That is to say, the sizes of the forksheet devices FS11, FS12 can be kept, but the electrical characteristics of the forksheet devices FS11, FS12 can be flexibly changed according to the design requirement.

Moreover, because the active region widths W111, W112, W113, W114 of the semiconductor components 111, 112, 113, 114 can be changed, the semiconductor components 111, 112, 113, 114 may have different contact size.

Figure 2:
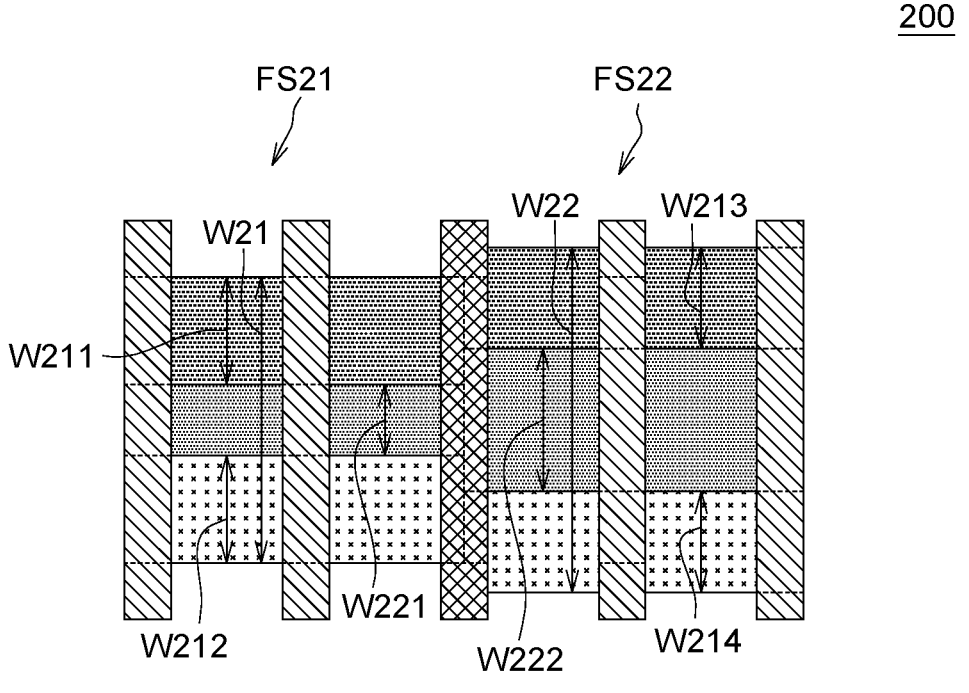
FIG. 2 shows a semiconductor device according to another embodiment.

Please refer to FIG. 2, which shows a semiconductor device 200 according to another embodiment. In FIG. 2, the total width W21 of the forksheet device FS21 is different from the total width W22 of the forksheet device FS22, the difference between the wall width W221 and the wall width W222 is different from the difference between the sum of the active region widths W211, W212 and the sum of the active region widths W213, W214. That is to say, even if the sizes of the forksheet devices FS21, FS22 are changed, but the electrical characteristics of the forksheet devices FS21, FS22 can be fixed according to the design requirement.

Further, because the total widths W21, W22 of the forksheet devices FS21, FS22 can be different, the forksheet devices FS21, FS22 may have different contact poly pitch (CPP) or different cell height.

Figure 3A:
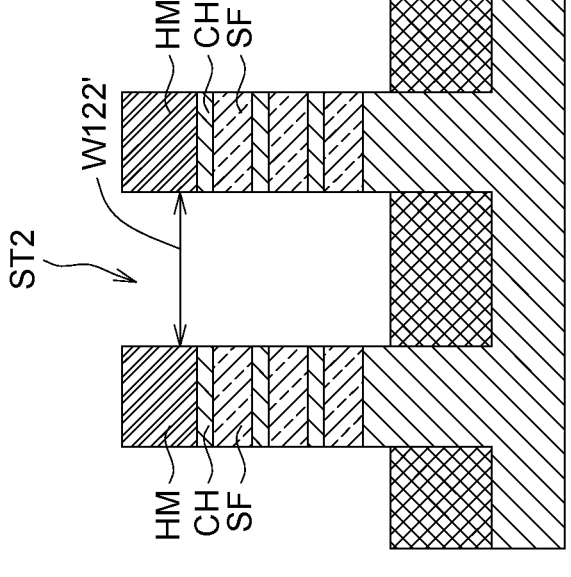
FIGS. 3A to 3C illustrate a manufacturing method of the semiconductor device.
Figure 3A:
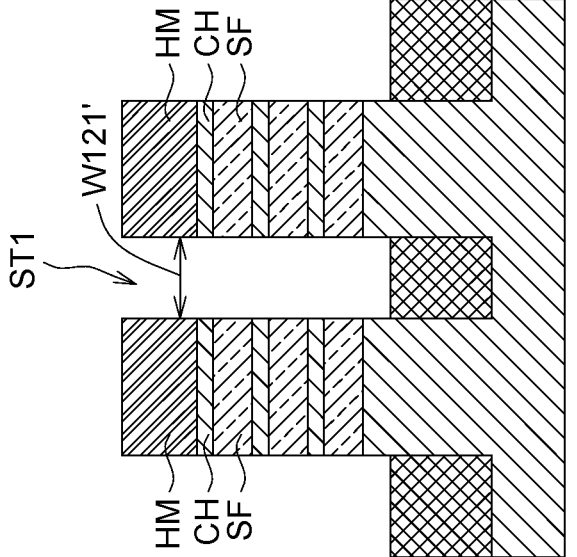
Figure 3B:
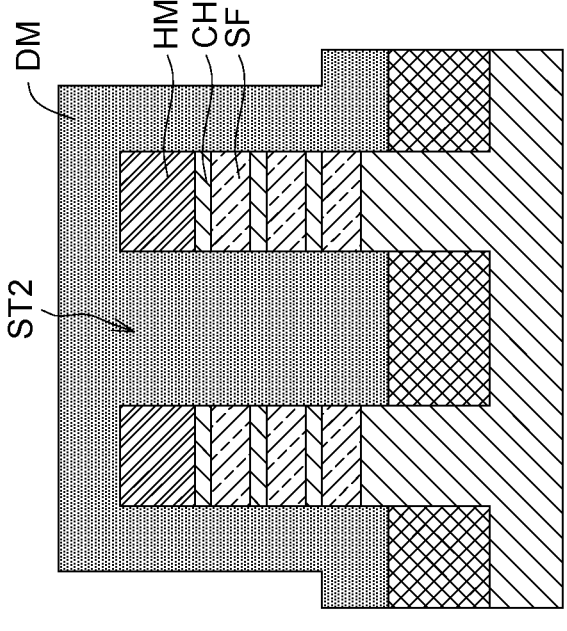
Figure 3B:
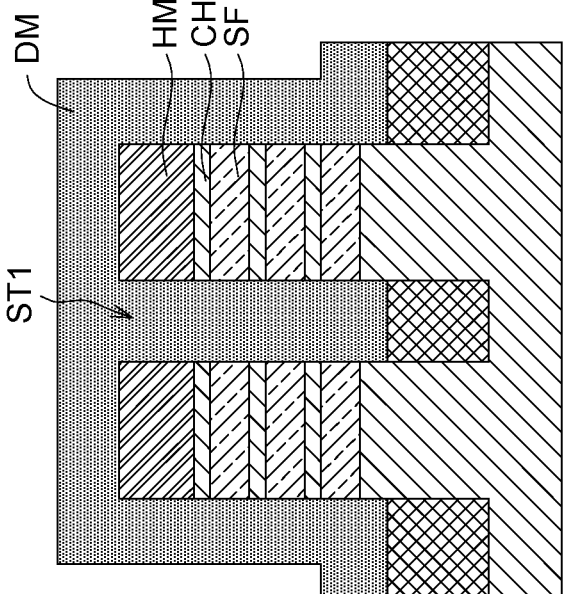
Figure 3C:
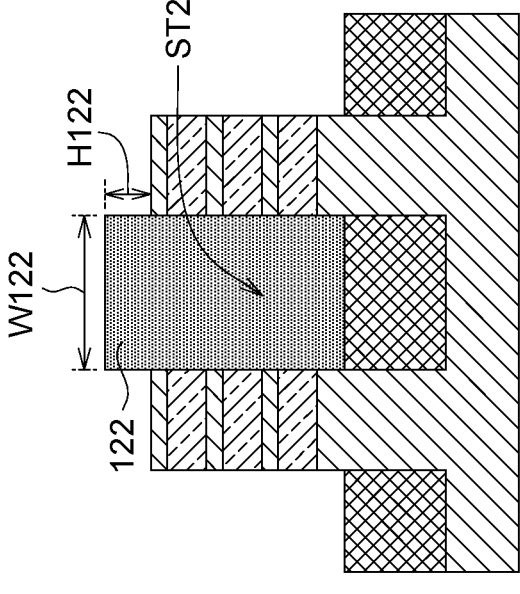
Figure 3C:
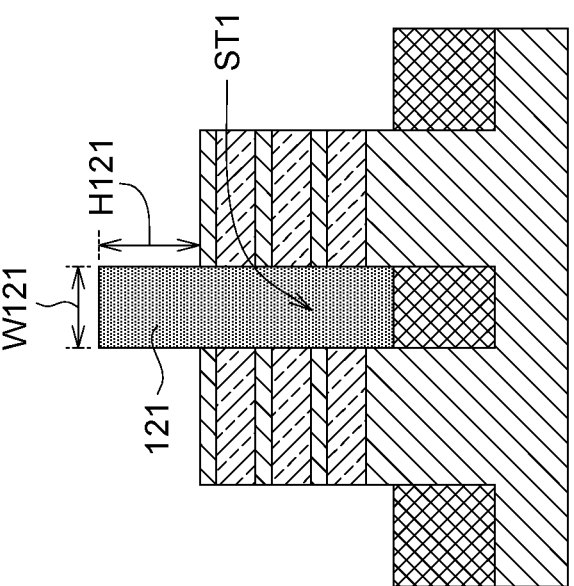

Please refer to FIGS. 3A to 3C, which illustrate a manufacturing method of the semiconductor device 100. Each of left drawings in FIGS. 3A to 3C is a sectional view at the section line 1-1' of FIG. 1; each of right drawings in FIGS. 3A to 3C is a sectional view at the section line 2-2' of FIG. 1. The dielectric walls 121, 122 having different wall widths W121, W122 can formed via shallow trench isolation technology.

For example, as shown in FIG. 3A, a slit ST1 is formed between two stacks of a plurality of sacrificial layers SF, a plurality of channel material layers CH and a sacrificial hard mask HM, and another slit ST2 is formed between two stacks of the sacrificial layers SF, the channel material layers CH and the sacrificial hard mask HM. The width W121' of the slit ST1 is less than the width W122' of the slit ST2.

Then, as shown in FIG. 3B, a dielectric material DM is formed in the slits ST1, ST2 and covers the stacks of the sacrificial layers SF, the channel material layers CH and the sacrificial hard mask HM.

Afterwards, as shown in FIG. 3C, part of the dielectric material DM and the hard mask HM are removed. Some of the dielectric material DM are remained at the slots ST2, ST1 to form the dielectric walls 121, 122.

According to FIGS. 3A to 3C, the wall widths W121, W122 of the dielectric walls 121, 122 can be defined via the widths W121', W122' of the slots ST1 and ST2. The location of the dielectric walls 121, 122 can be defined via the location of the slots ST1, ST2.

As shown in FIG. 3C, the wall width W121 is less than the wall width W122, and the wall height H121 is larger than the height H122. There is an inverse relationship between the wall widths W121, W122 and the wall heights H121, H122. In one embodiment, the wall width W121, W122 may be 10 nm to 80 nm, and the wall heights H121, H122 may be 0 nm to 60 nm.

Figure 4:
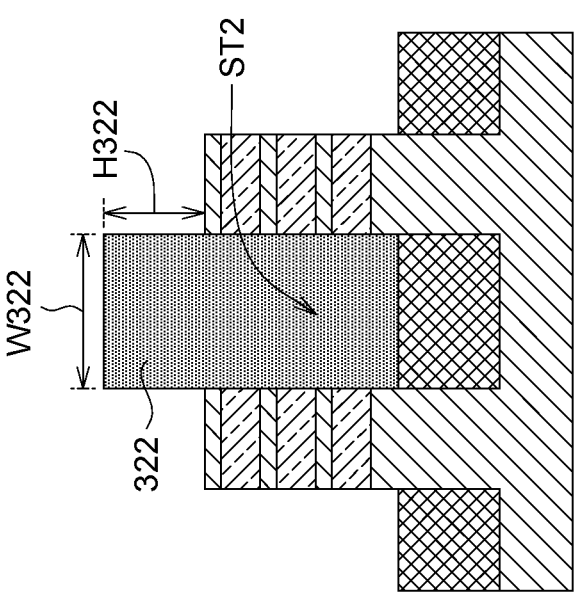
FIG. 4 shows a sectional view of two dielectric walls according to another embodiment.
Figure 4:
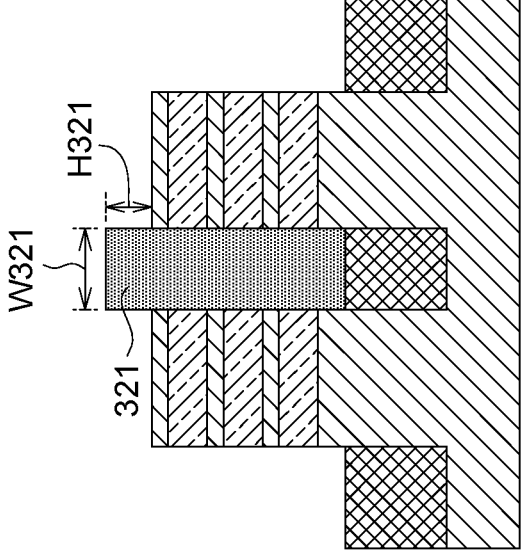

Please refer to FIG. 4, which shows a sectional view of two dielectric walls 321, 322 of a semiconductor device 300 according to another embodiment. In the embodiment of FIG. 4, the wall width W321 is less than the wall width W322, and the wall height H321 is less than the height H322. There is a positive relationship between the wall widths W321, W322 and the wall heights H321, H322. In one embodiment, the wall width W321, W322 may be 10 nm to 80 nm, and the wall heights H321, H322 may be 0 nm to 60 nm.

Figures 5, 6:
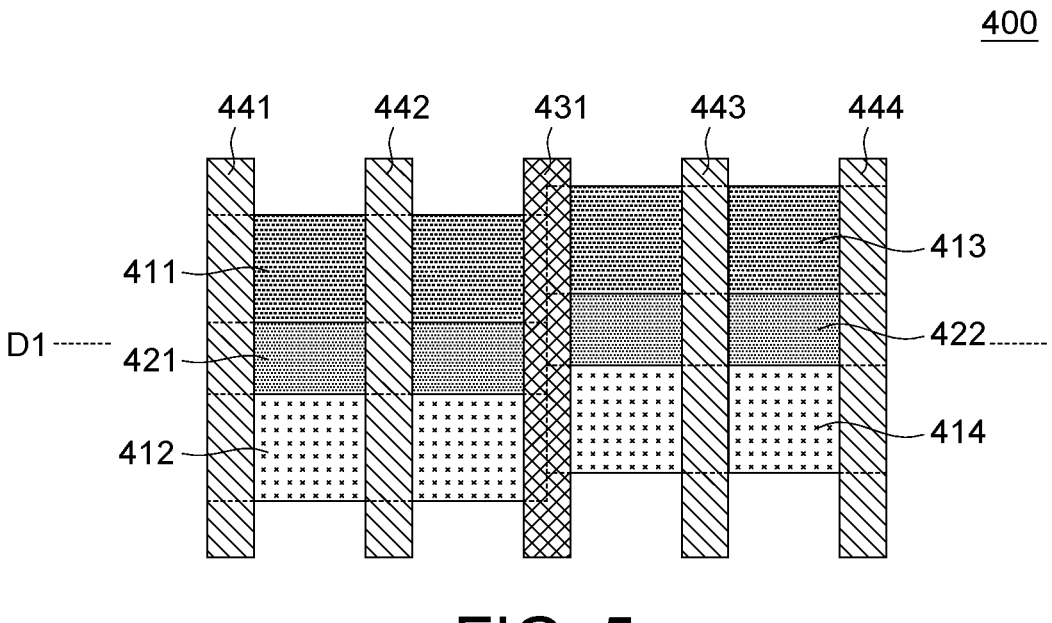
FIG. 5 shows a semiconductor device according to one embodiment.
FIG. 6 shows a semiconductor device according to another embodiment.

Please refer to FIG. 5, which shows a semiconductor device 400 according to one embodiment. The semiconductor device 400 includes, for example, a plurality of semiconductor components 411, 412, 413, 414, a plurality of dielectric walls 421, 422, at least one device isolation 431, and at least two gates 441, 442, 443, 444. Referring to FIG. 5, the two dielectric walls 421, 422 are disposed among the semiconductor components 411, 412, 413, 414. The two dielectric walls 421, 422, which are adjacent, offset. The two dielectric walls 421, 422, which are extended along one direction D1, offset. The two dielectric walls 421, 422, which are disposed at two sides of the device isolation 431, offset. That is to say, the dielectric walls 421, 422, which are adjacent, extended along one direction D1, or disposed at two sides of the device isolation 431, do not need to be precisely aligned, so the device architecture can be flexible. For example, the semiconductor component 411 and the semiconductor component 413 do not need to be precisely aligned or have the same size, and the semiconductor component 412 and the semiconductor component 414 do not need to be precisely aligned or have the same size.

Please refer to FIG. 6, which shows a semiconductor device 500 according to another embodiment. According to the design requirement, the forksheet device FS51 of the semiconductor device 500 may include only one gate 541, and the forksheet device FS52 of the semiconductor device 500 may include only one gate 543.

Figure 7:
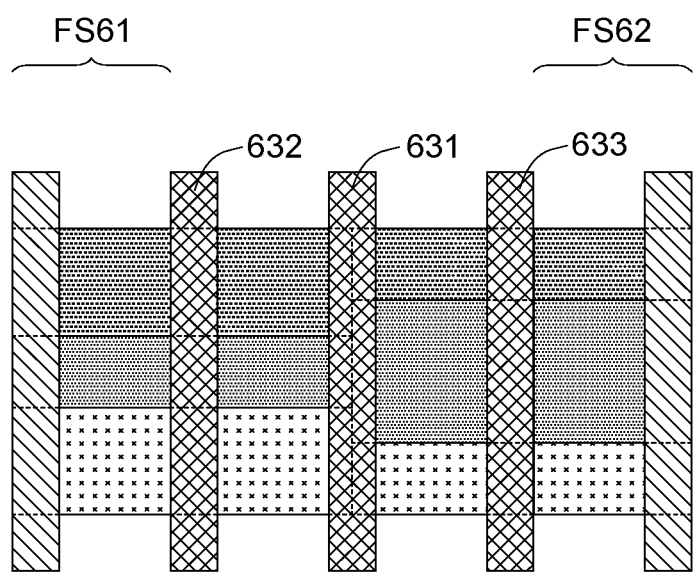
FIG. 7 shows a semiconductor device according to another embodiment.

Please refer to FIG. 7, which shows a semiconductor device 600 according to another embodiment. According to the design requirement, the semiconductor device 600 may include more than one device isolations 631, 632, 633. The device isolation 631, 632, 633 are disposed between the two forksheet devices FS61, FS62 to more effectively avoid any interference between the forksheet devices FS61, FS62.

Figure 8:
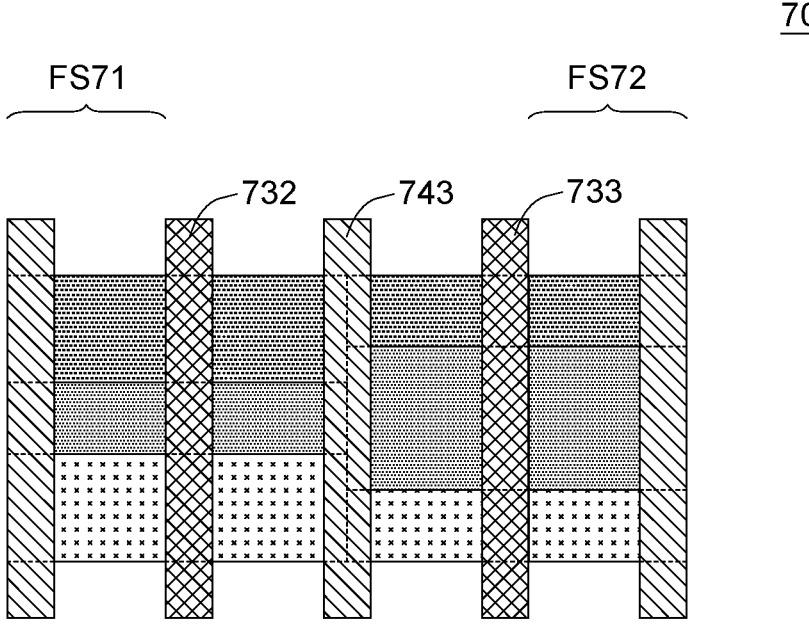
FIG. 8 shows a semiconductor device according to another embodiment.

Please refer to FIG. 8, which shows a semiconductor device 700 according to another embodiment. According to the design requirement, the semiconductor device 700 may include more than one device isolations 732, 733 and one dummy gate 743. The device isolation 732, 733 and the dummy gate 743 are disposed between the two forksheet devices FS71, FS72 to more effectively avoid any interference between the forksheet devices FS71, FS72.

Figure 9:
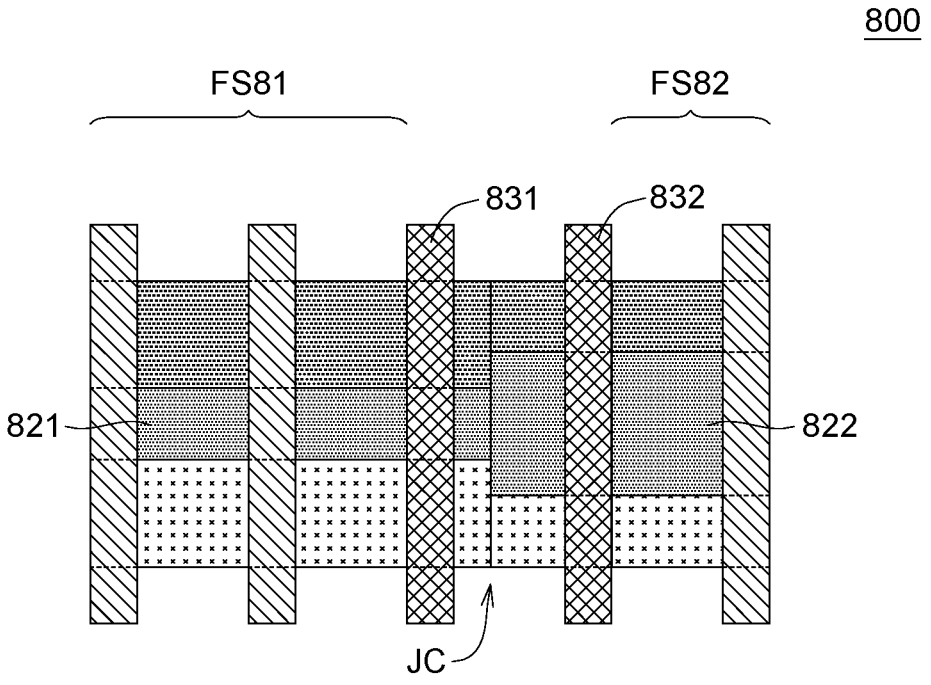
FIG. 9 shows a semiconductor device according to another embodiment.

Please refer to FIG. 9, which shows a semiconductor device 800 according to another embodiment. According to the design requirement, the semiconductor device 800 may include more than one device isolations 831, 832. The device isolation 831, 832 are disposed between the two forksheet devices FS81, FS82 to more effectively avoid any interference between the forksheet devices FS81, FS82. In FIG. 9, the device isolations 831, 832 are not located on the junction JC between the dielectric walls 821, 822. As shown in FIG. 9, the device isolations 831, 832 are located two sides of the junction JC, so the device isolations 831, 832 may avoid any interference between the forksheet devices FS81, FS82.

Base on above, two dielectric walls, which are adjacent, extended along one direction or disposed at two sides of the device isolation, have varied wall widths or are offset. The device architecture can be flexible via Device-technology co-optimization (DTCO) and good integration compatibility can be obtained.

According to some embodiments, a semiconductor device is provided. The semiconductor includes a plurality of semiconductor components and at least two dielectric walls disposed among the semiconductor components. Two of the dielectric walls, which are adjacent, have varied wall widths or are offset.

According to some embodiments, a semiconductor device is provided. The semiconductor device 100 includes a plurality of semiconductor components and at least two dielectric walls disposed among the semiconductor components. Two of the dielectric walls, which are extended along one direction, have varied wall widths or are offset.

According to some embodiments, a semiconductor device is provided. The semiconductor device includes a plurality of semiconductor components and at least one device isolation disposed between two of the semiconductor components. At least two dielectric walls disposed among the semiconductor components. Two of the dielectric walls, which are disposed at two sides of the device isolation, have varied wall widths or are offset.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a plurality of semiconductor components; and
at least two dielectric walls disposed among the semiconductor components, wherein two of the dielectric walls, which are adjacent, have varied wall widths or are offset;
wherein two of the dielectric walls, which are adjacent, have varied wall heights, and there is an inverse relationship between a plurality of active region widths of the semiconductor components and the wall widths.

2. The semiconductor device according to claim 1, further comprising:
at least one device isolation, disposed between two of the dielectric walls having varied wall widths.

3. The semiconductor device according to claim 1, wherein there is an inverse relationship between the wall widths and the wall heights.

4. The semiconductor device according to claim 1, wherein there is a positive relationship between the wall widths and the wall heights.

5. The semiconductor device according to claim 1, wherein a plurality of active region widths of the semiconductor components are different.

6. The semiconductor device according to claim 1, wherein total widths of the semiconductor components are identical.

7. The semiconductor device according to claim 1, wherein the active region widths of the semiconductor components are different.

8. A semiconductor device, comprising:
a plurality of semiconductor components; and
at least two dielectric walls disposed among the semiconductor components, wherein two of the dielectric walls, which are extended along one direction, have varied wall widths or are offset;
wherein two of the dielectric walls, which are extended along one direction, have varied wall heights, and there is an inverse relationship between a plurality of active region widths of the semiconductor components and the wall widths.

9. The semiconductor device according to claim 8, further comprising:
at least one device isolation, disposed between two of the dielectric walls having varied wall widths.

10. The semiconductor device according to claim 8, wherein there is an inverse relationship between the wall widths and the wall heights.

11. The semiconductor device according to claim 8, wherein there is a positive relationship between the wall widths and the wall heights.

12. The semiconductor device according to claim 8, wherein a plurality of active region widths of the semiconductor components are different.

13. The semiconductor device according to claim 8, wherein total widths of the semiconductor components are identical.

14. The semiconductor device according to claim 8, wherein the active region widths of the semiconductor components are different.

15. A semiconductor device, comprising:
a plurality of semiconductor components;
at least one device isolation, disposed between two of the semiconductor components; and
at least two dielectric walls disposed among the semiconductor components, wherein two of the dielectric walls, which are disposed at two sides of the device isolation, have varied wall widths or are offset;
wherein two of the dielectric walls, which are disposed at two sides of the device isolation, have varied wall heights, and there is an inverse relationship between a plurality of active region widths of the semiconductor components and the wall widths.

16. The semiconductor device according to claim 15, wherein there is an inverse relationship between the wall widths and the wall heights.

17. The semiconductor device according to claim 15, wherein there is a positive relationship between the wall widths and the wall heights.

18. The semiconductor device according to claim 15, wherein a plurality of active region widths of the semiconductor components are different.

19. The semiconductor device according to claim 15, wherein total widths of the semiconductor components are identical.

20. The semiconductor device according to claim 15, wherein the active region widths of the semiconductor components are different.

\* \* \* \* \*